US009798087B1

(12) United States Patent
Mathai et al.

(10) Patent No.: US 9,798,087 B1
(45) Date of Patent: Oct. 24, 2017

(54) OPTOELECTRONIC DEVICES AND WAVELENGTH-DIVISION MULTIPLEXING OPTICAL CONNECTORS

(71) Applicant: HEWLETT PACKARD ENTERPRISE DEVELOPMENT LP, Houston, TX (US)

(72) Inventors: Sagi Mathai, Palo Alto, CA (US); Michael Renne Ty Tan, Palo Alto, CA (US); Wayne Victor Sorin, Palo Alto, CA (US); Paul Kessler Rosenberg, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/340,534

(22) Filed: Nov. 1, 2016

(51) Int. Cl.
*G02B 6/12* (2006.01)
*G02B 6/32* (2006.01)
*G02B 6/36* (2006.01)
*G02B 6/42* (2006.01)
(Continued)

(52) U.S. Cl.
CPC ..... *G02B 6/29367* (2013.01); *G02B 6/12004* (2013.01); *G02B 6/2938* (2013.01); *G02B 6/32* (2013.01); *G02B 6/423* (2013.01); *G02B 6/4204* (2013.01); *G02B 6/425* (2013.01); *G02B 6/428* (2013.01); *G02B 6/4214* (2013.01); *G02B 6/4215* (2013.01); *G02B 6/4232* (2013.01); *G02B 6/4269* (2013.01);
(Continued)

(58) Field of Classification Search
CPC ............ G02B 6/12004; G02B 6/12104; G02B 6/29367; G02B 6/2938; G02B 6/32; G02B 6/4204; G02B 6/4214; G02B 6/4215; G02B 6/423; G02B 6/4232; G02B 6/425; G02B 6/4269; G02B 6/428; G02B 6/4292; G02B 6/4295; H01S 5/4043
USPC ........ 385/14, 15, 24, 31, 33, 37, 47, 49, 52, 385/88–94; 372/102; 438/31–32
See application file for complete search history.

(56) References Cited

U.S. PATENT DOCUMENTS 6,754,407 B2   6/2004 Chakravorty et al.
6,800,946 B2   10/2004 Chason et al.
6,870,976 B2   3/2005 Chen et al.
(Continued)

OTHER PUBLICATIONS

Takuya Oda et al., "Development of Underfilling Method for Flip Chip Mounted VCSEL," Technical Paper, 2013, pp. 63-69, Japan.

*Primary Examiner* — Akm Enayet Ullah
*Assistant Examiner* — Michael Mooney
(74) *Attorney, Agent, or Firm* — Hewlett Packard Enterprise Development Patent Department

(57) ABSTRACT

Example implementations relate to mounting optoelectronic devices and wavelength-division multiplexing optical connectors. For example, an implementation includes a transparent interposer having an integrated plurality of lenses. A plurality of optoelectronic devices are mounted to a bottom surface of the transparent interposer, each of the optoelectronic devices being paired to a respective lens of the plurality of lenses. The bottom surface of the transparent interposer is mounted to a substrate within a region of an optical socket. The optical socket receives a filter-based wavelength-division multiplexing (WDM) optical connector. Each lens of the plurality of lenses is paired to a respective filter of the WDM optical connector when the WDM optical connector is mated to the optical socket.

20 Claims, 7 Drawing Sheets

(51) Int. Cl.
*G02B 6/293* (2006.01)
*H01S 5/40* (2006.01)

(52) U.S. Cl.
CPC ......... *G02B 6/4292* (2013.01); *G02B 6/4295* (2013.01); *H01S 5/4043* (2013.01); *G02B 2006/12104* (2013.01)

(56) References Cited

U.S. PATENT DOCUMENTS

| | | | |
|---|---|---|---|
| 7,004,645 B2 | 2/2006 | Lemoff et al. | |
| 7,260,328 B2* | 8/2007 | Kropp | G02B 6/29367 385/47 |
| 7,349,602 B2* | 3/2008 | Panotopoulos | G02B 6/29367 385/24 |
| 8,600,236 B2 | 12/2013 | Shin et al. | |
| 9,038,883 B2 | 5/2015 | Wang et al. | |
| 2005/0069013 A1* | 3/2005 | Bhandarkar | G02B 6/4204 372/102 |
| 2006/0251422 A1 | 11/2006 | Liu | |

\* cited by examiner

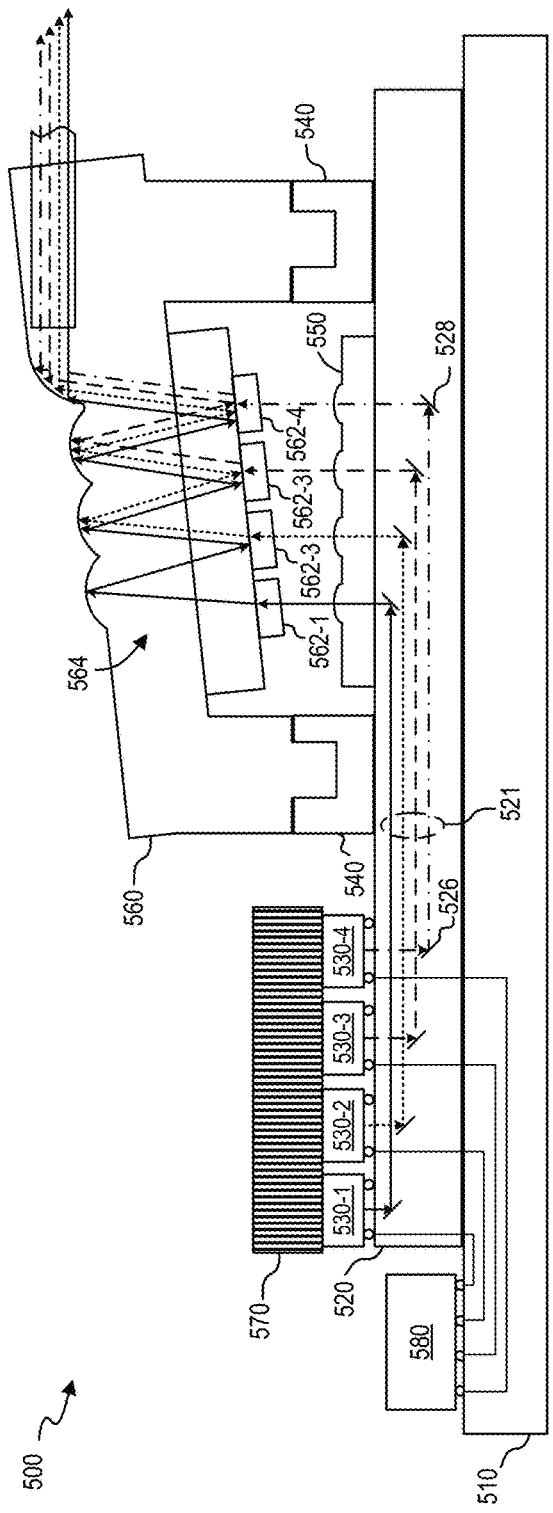
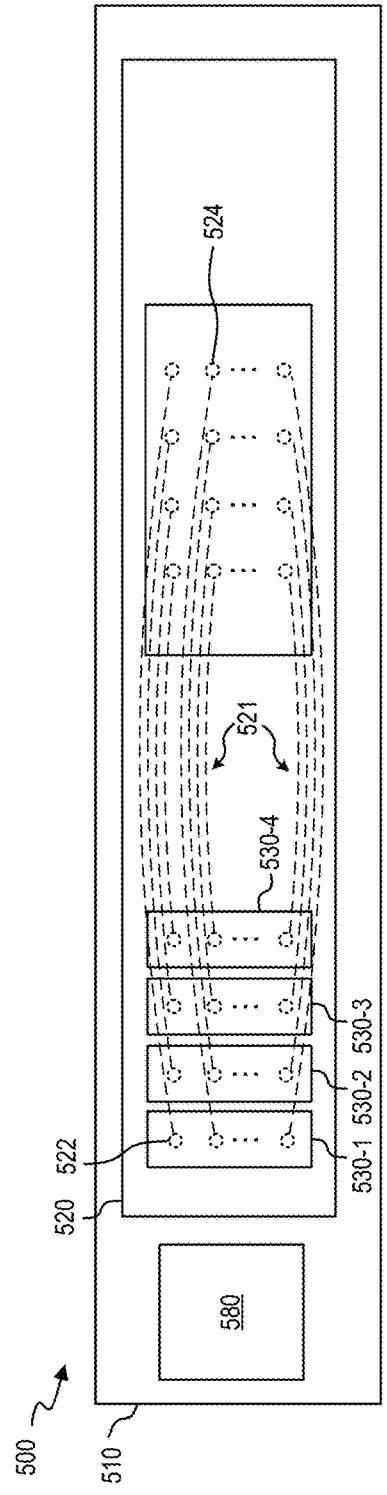
FIG. 5A
FIG. 5B

OPTOELECTRONIC DEVICES AND WAVELENGTH-DIVISION MULTIPLEXING OPTICAL CONNECTORS

BACKGROUND

Wavelength-division multiplexing (WDM) may be used to increase communication bandwidth by sending multiple data channels operating at different wavelengths down a single waveguide, such as an optical fiber. A multiplexer is used to join the signals together before transmission, and a demultiplexer is used to separate a received signal into constituent signals.

BRIEF DESCRIPTION OF THE DRAWINGS

Various examples will be described below with reference to the following figures.

FIG. 5A depicts another example apparatus that includes optoelectronic devices mounted to a waveguide device and a lens array disposed on the waveguide device.

FIG. 5B depicts a top view of the example apparatus depicted in FIG. 5A as a side view.

Figure 1:
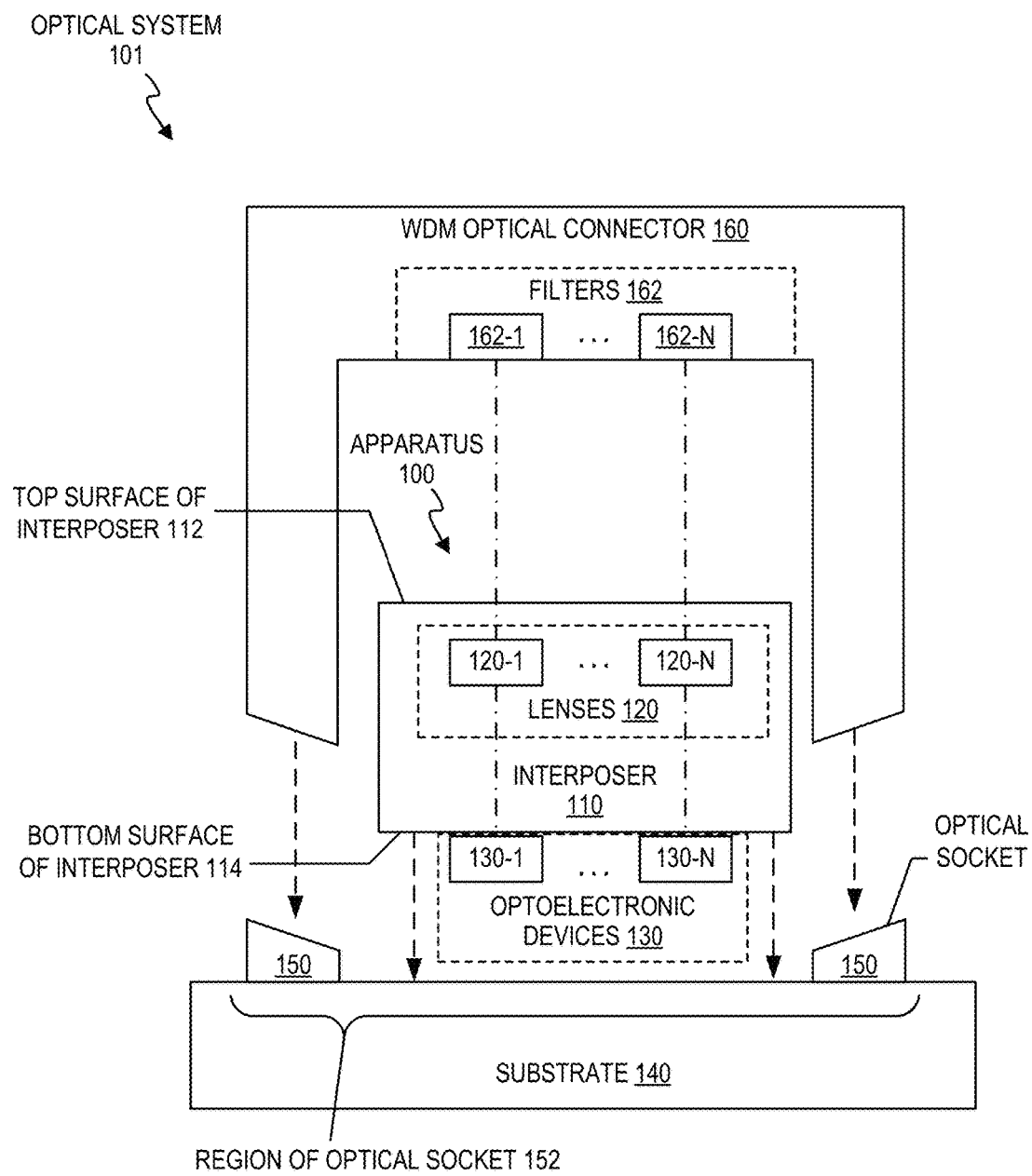
FIG. 1 depicts an example apparatus that includes optoelectronic devices mounted to a transparent interposer.

Throughout the drawings, a hyphenated index number "N" appended to some of the reference numerals may be understood to merely denote plurality. Additionally, use herein of a reference numeral without a hyphenated index number, where such reference numeral is referred to elsewhere with a hyphenated index number, may be a general reference to the corresponding plural elements, collectively or individually.

DETAILED DESCRIPTION

Wavelength-division multiplexing (WDM) combines multiple data channels at different wavelengths into a waveguide or optical fiber (i.e., multiplexing) or to separate received light into constituent data channels at different wavelengths (i.e., demultiplexing). WDM may be useful for data transmission in datacenter and networking applications.

For example, a plurality of light sources such as vertical-cavity surface-emitting lasers (VCSELs) operating at different wavelengths may emit multiple wavelengths of light into a filter-based WDM optical connector for multiplexing. A WDM optical connector also may demultiplex a multiplexed light signal, and the demultiplexed light may be detected by a plurality of photodetectors or the like.

A filter-based WDM optical connector may be an efficient approach to multiplex or demultiplex light. A filter-based WDM optical connector may include a plurality of wavelength-selective filters disposed at a first surface of an optical body formed of, e.g., glass, plastic, SiO2, etc., and reflective relay lenses at a second surface of the optical body. The filters correspond to the wavelengths of the multiplexed data channels and may allow light of those wavelengths to enter or leave the optical body but may reflect light of other wavelengths. Internally within the optical body, light may be reflected between the filters and reflective relay lenses. In particular, the filters and reflective relay lenses may be offset so as to form a mode-matched optical zig-zag cavity.

A WDM optical connector may be employed in a multiplexing scenario in the following manner. For example, light sources of different wavelengths are aimed at filters having corresponding wavelength characteristics. Light emitted by the light sources enter the corresponding filter, and by virtue of the optical zig-zag cavity, light from the filters is multiplexed into a single beam that is coupled into a waveguide (e.g. optical fiber).

In a demultiplexing scenario, light may traverse a same or similar WDM optical connector in effectively an opposite direction than as described in the multiplexing scenario. In a demultiplexing scenario, light having multiple wavelengths enters the WDM optical connector from a coupled waveguide (e.g., optical fiber) and is internally reflected by the optical zig-zag cavity. Light of selective wavelengths exit the optical zig-zag cavity upon reaching corresponding filters. Detectors may be aimed to receive light exiting from the filters. Thus, the WDM optical connector can spatially separate different wavelengths of light from a multiplexed signal.

However, coupling of light into and out of such filter-based WDM connectors may be sensitive to angular misalignments. In a WDM system, back-emitting VCSELs and substrate-entry photodetectors may be employed with integrated collimating and focusing lenses, respectively, and flip chipped onto an organic substrate, but such implementations result in high aspect ratio (i.e., tall and narrow) chips. When such back-emitting VCSEL or substrate-entry photodetector chips are flip chip solder reflowed, the reflow process may result in the chips tipping about a long-dimension, thus causing a beam pointing error when assembled to a WDM optical connector.

Examples described herein enable the use of low aspect ratio optoelectronic device assemblies to minimize angular misalignment with downstream optics, including a WDM optical connector. Accordingly, coupling efficiency between the optoelectronic devices and a WDM optical connector may be improved. The examples described herein also enable the use of top emitting VCSELs and surface illuminated photodetectors.

For example, in one implementation, optoelectronic devices such as top emitting VCSELs may be flip chip solder reflowed to a bottom surface of a transparent interposer, and the interposer-VCSEL assembly (also referred to as an optical engine) may be flip chip solder reflowed in turn to a substrate. Solder reflow may self-align the VCSELs and the interposer to the interposer and substrate, respectively. An optical socket may be disposed around the optical engine, and the optical socket may align a WDM optical connector with the optical engine. By virtue of the foregoing implementation, low aspect ratio optoelectronic devices may be employed and optical coupling of light between the optoelectronic devices and WDM optical connector may be improved.

In another implementation, optoelectronic devices such as top emitting VCSELs may be flip chip solder reflowed to one end of a waveguide device. Solder reflow may self-align the VCSELs to the end of the waveguide device. The other end of the waveguide device may be coupled to a lens array within an optical socket that receives a WDM optical connector. The lens array may be solder reflowed and thus self-aligned to that other end of the waveguide device. Light is transmitted between the optoelectronic devices and the WDM optical connector via the waveguide device. By virtue of this implementation, design considerations of the optoelectronic devices (e.g., thermal and electrical considerations) may be separated from design considerations of optomechanical components including the WDM optical connector, lens array, and optical socket (e.g., size considerations).

Referring now to the figures, FIG. 1 depicts an example apparatus 100. The apparatus 100 includes a transparent interposer 110 and a plurality of optoelectronic devices 130-1 through 130-N. The interposer 110 may be formed from glass, plastic, or other transparent materials suitable for optical applications.

The apparatus 100 may serve as an optical engine that generates, detects or generates and detects optical signals. The apparatus 100 may be employed in an optical system 101 that includes the optical engine apparatus 100 and components to be described below, such as a substrate 140, an optical socket 150, and a wavelength-division multiplexing optical connector 160.

The transparent interposer 110 has a top surface 112 and a bottom surface 114 opposite the top surface 112. The transparent interposer 110 includes an integrated plurality of lenses 120-1 through 120-N. The lenses 120 may be at the top surface 112, the bottom surface 114, or between the top and bottom surfaces.

The plurality of optoelectronic devices 130 are mounted to the bottom surface 114 of the transparent interposer 110. Each of the optoelectronic devices 130 is paired to a respective lens of the plurality of lenses 120, as depicted by the dot-dash lines between the lenses 120-1 and 120-N and the optoelectronic devices 130-1 and 130-N, respectively. The lenses 120 may be collimating lenses. Pairing (or pair or paired), as referred to herein, may be understood to mean that optical components (e.g., a lens 120 and filter 162) are on a same optical path traversed by a beam of light.

The bottom surface 114 of the transparent interposer 110 is to be mounted to a substrate 140, such as an organic substrate. More particularly, an optical socket 150 may be mounted to the substrate 140, and the bottom surface 114 is to be mounted within a region 152 of the optical socket 150. For example, the optical socket 150 may demarcate the region 152 by, for example, at least partially enclosing or framing a portion of the substrate 140, and the transparent interposer 110 may be mounted to the substrate 140 within that demarcated region 152. When the transparent interposer 110 is mounted to the substrate 140, the optoelectronic devices 130 are positioned between the interposer 110 and the substrate 140.

The optical socket 150 is to receive a filter-based wavelength-division multiplexing optical connector 160, as depicted by dashed arrows in FIG. 1. For example, the optical socket 150 and the WDM optical connector 160 may have mating features that allow for mechanical coupling, such as a latch, a hole, a pin, a sphere, or the like. The WDM optical connector 160 may include a plurality of filters 162-1 through 162-N (also referred to collectively as filters 162 or individually and generally as a filter 162). The filters selectively allow passage of certain wavelengths of light, and in some implementations, some of the filters 162 selectively allow different wavelengths of light than others of the filters 162. In some implementations, the filters 162 may work in conjunction with other elements of the WDM optical connector 160 (e.g., an optical body with reflective relay lenses) to provide an optical zig-zag cavity for multiplexing or demultiplexing light. The WDM optical connector 160 may be coupled to a waveguide or optical fiber for transmission of multiplexed light.

In particular, with the interposer 110 mounted to the substrate 140, each lens of the plurality of lenses 120 is paired to a respective filter 162 of the WDM optical connector 160 when the WDM optical connector 160 is mated to the optical socket 150. Such pairing is depicted by the dot-dash lines between lenses 120-1 and 120-N and filters 162-1 and 162-N, respectively. In some implementations, the optical axes of the lenses are aligned to the center line of the filters. In other implementations, the optical axes of the lenses are not aligned to the center line of the filters.

In some implementations, the optoelectronic devices 130 may include top emitting vertical-cavity surface-emitting lasers (VCSELs) that can emit light into and through the transparent interposer 110. Each VCSEL optoelectronic device 130 may be aimed through a respective lens 120 (which may be, e.g., a collimating lens) and at a filter 162 having a wavelength characteristic associated with that VCSEL. Thus, light emitted by a plurality of top emitting VCSEL optoelectronic devices 130 can be multiplexed by the WDM optical connector 160. The VCSEL devices 130 may be fabricated with one-dimensional or two-dimensional arrays of VCSELs.

In some implementations, the optoelectronic devices 130 may include surface illuminated photodetectors. Each photodetector optoelectronic device 130 may be positioned to receive light through a respective lens 120 from a filter 162. Accordingly, light demultiplexed by the WDM optical connector 160 may be detected by photodetector optoelectronic devices 130. The photodetector optoelectronic devices 130 may be a single chip or multiple chips with individual photodetectors or arrays of photodetectors.

Figure 2:
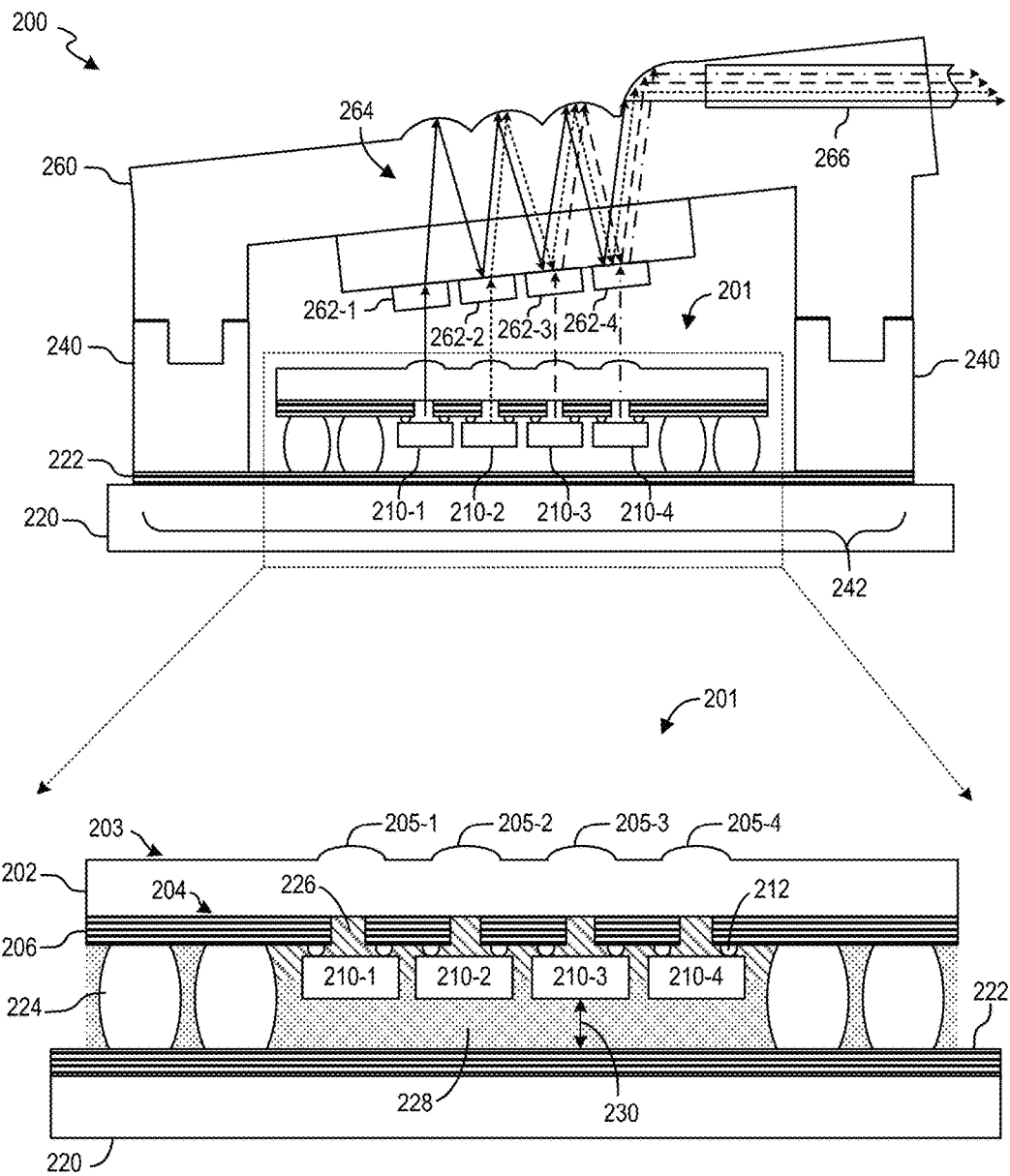
FIG. 2 depicts another example apparatus that includes optoelectronic devices mounted to a transparent interposer.

FIG. 2 depicts an example optical system 200 that employs an apparatus 201 that includes optoelectronic devices 210-1, 210-2, 210-3, 210-4 mounted to a transparent interposer 202. FIG. 2 also shows a magnified view of the apparatus 201. Although four optoelectronic devices 210 are illustrated in FIG. 2, it should be understood that more or fewer optoelectronic devices may be employed in a manner consistent with the present disclosure. The apparatus 201 may be manufactured using wafer scale fabrication, testing, and assembly techniques. The optical system 200 may serve as an implementation of the optical system 101.

The optical system 200 may include the apparatus 201, a substrate 220, an optical socket 240, and a WDM optical connector 260. The apparatus 200 may serve as an optical engine that generates and/or detects optical signals, by virtue of the optoelectronic devices 210. The optoelectronic devices 210 may be communicatively coupled to an integrated circuit or other like electronics. The optical system 200 may be useful for transmitting or receiving WDM light signals (and converting to or from electronic signals), and may form part of an optical link in a datacenter, networking system, or the like.

In some implementations, the substrate 220 may be an organic substrate for flip chip assembly. A redistribution layer 222 (RDL) may be disposed on the substrate 220 (e.g., by photolithography, lamination, bonding, metal plating, etc.), and may be useful for routing electrical signals to and/or from the optoelectronic devices 210 in a manner described below. RDLs are depicted as horizontal stripe-filled element(s) in FIG. 2. The RDL 222 may be composed of single or multiple metal traces and pads separated by an electrically insulating material (e.g., polyimide, silicon dioxide, silicon nitride, BCB, etc.).

An optical socket 240 may be mounted to the substrate 220. In some implementations, the optical socket 240 may form a frame or enclosure so as to define a region 242 of the substrate 220. For example, the optical socket 240 may be a rectangular frame. FIG. 2 may be understood to show a cross-sectional side view of the optical socket 240 (and of the optical system 201 generally) and thus depicts cross-sections of two sides of an example frame-shaped optical socket 240. The apparatus 200 may be flip chip solder reflowed to the substrate 220 within the region defined by (or demarcated by or enclosed by) the optical socket 240. In other implementations, the optical socket 240 may partially enclose the region (e.g., four posts at corners of a rectangle), but even so, a perimeter around the optical socket 240 may define or demarcate the region 242.

The optical socket 240 may receive a filter-based WDM optical connector 260. The WDM optical connector 260 may include a plurality of optical filters 262-1, 262-2, 262-3, 262-4 and an optical zig-zag cavity 264.

The apparatus 200 includes a transparent interposer 202 having a lens array. The interposer 202 includes a top surface 203 and a bottom surface 204 opposite the top surface 203. The lens array, and thus the interposer 202, may be formed from glass, plastic, or other optically transparent material. The lens array may include a plurality of lenses 205-1, 205-2, 205-3, 205-4. In some implementations, the lenses 205 may be formed at the top surface 203 of the interposer 202, as depicted in FIG. 2. Other arrangements of lenses on an interposer will be described below with respect to FIGS. 3A, 3B, and 3C. The lenses 205 may be collimating lenses (i.e., single convex lenses as shown), but other types of lenses (e.g., focusing lenses) may also be employed.

The interposer 202 may include an RDL 206 on the bottom surface 204. The RDL 206 may be similar in many respects (e.g., in fabrication, structure, etc.) to the RDL 222. The plurality of optoelectronic devices 210 may be flip chip solder reflowed to the RDL 206 on the bottom surface 204 by way of a first set of solder bumps 212. Each of the optoelectronic devices 210 may be paired to a respective lens of the plurality of lenses 205. For example, the optoelectronic device 210-1 is paired with the lens 205-1, the optoelectronic device 210-2 is paired with the lens 205-2, and so on. In some implementations, optical axes of an optoelectronic device 210 and a corresponding lens 205 align. In other implementations, an optoelectronic device 210 may be offset in relation to a corresponding lens 205, so as to induce an intentional deflection in light path. For example, an intentional deflection may be useful for coupling light into or out of the WDM optical connector 260 at certain geometries.

In some implementations, an optically transparent underfill 226 (depicted as diagonal hash-filled spaces in the figures) may be applied between the bottom surface 204 of the transparent interposer 202 and the plurality of optoelectronic devices 210 mounted to the bottom surface 204 of the transparent interposer 202. In some implementations, the optically transparent underfill 226 may be index matched to the interposer 202 and may reduce optical loss between the optoelectronic device 210 and the interposer 202. Moreover, the optically transparent underfill 226 may help protect or seal the optoelectronic devices 210 from the environment, including dust and other contaminants, and the assembly process.

The bottom surface 204 of the transparent interposer 202 (or the RDL 206 more particularly) may be flip chip solder reflowed to the substrate 220 (or the RDL 222 more particularly) by a second set of solder bumps 224. The second set of solder bumps 224 may be at least as tall as the optoelectronic devices 210 solder reflowed to the bottom surface 204. In other words, once the interposer 202 is flip chip solder reflowed to the substrate 220, a gap 230 between the optoelectronic devices 210 and the substrate 220 (or the RDL 222) is zero or greater. Electrical control and power signals may be transmitted between integrated circuitry and the optoelectronic devices 210 via the RDL layers 222, 206 and the conductive solder bumps 224, 212.

In a case where the gap 230 is zero, heat from the optoelectronic devices 210 may be dissipated through the substrate 220. In some implementations, a thermally conductive underfill 228 (depicted as dot-filled spaces in the figures) may be applied between the optoelectronic devices 210 and the substrate 220 and between the bottom surface 204 of the transparent interposer 202 and the substrate 220. The thermally conductive underfill 228 may help dissipate heat from the optoelectronic devices 210 through the substrate 220, particularly in cases where the gap 230 is non-zero and the optoelectronic devices 210 do not seat against the substrate 220 (or RDL 222). Moreover, the thermally conductive underfill 228 may help protect or seal the optoelectronic devices 210 from the environment, including dust and other contaminants. For example, a diamond powder filler may be used for the thermally conductive underfill 228.

In some cases, the RDL 222 and substrate 220 may be provisioned with thermal vias to improve heat transfer from the optoelectronic devices 210 into the RDL 222 and substrate 220. A thermal pad may be integrated with the thermal vias and may be located on the substrate 220 facing the optoelectronic devices 210. The thermal pad may provide a large surface area to transfer heat away from the optoelectronic devices 210. The thermal pad and thermal vias may be formed from a thermally conductive material, such as copper, and may be employed together with the thermally conductive underfill 228.

Figure 3A:
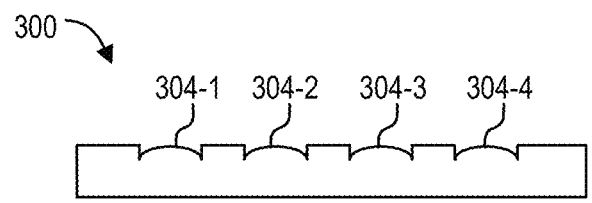
FIG. 3A depicts an example interposer.
Figure 3B:
FIG. 3B depicts another example interposer.
Figure 3C:
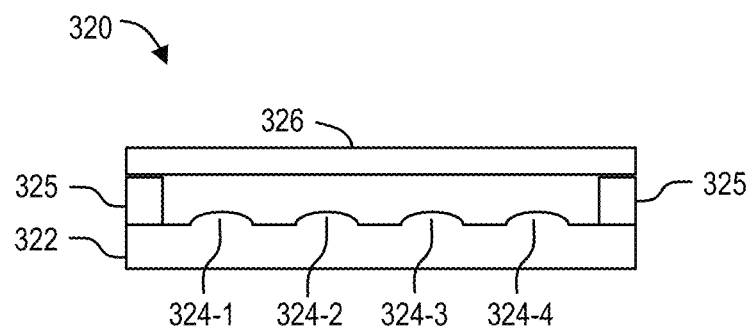
FIG. 3C depicts another example interposer.

FIGS. 3A, 3B, and 3C depict various implementations of interposers. The example interposers depicted in FIGS. 3A, 3B, and 3C may be substituted for the interposer 202 of assembly 200. FIG. 3A depicts a transparent interposer 300 with a plurality of lenses 304-1, 304-2, 304-3, 304-4 recessed at a top surface of the interposer 300. Recessing the lenses 304 may provide additional protection to the lenses 304. FIG. 3B depicts a transparent interposer 310 with a plurality of lenses 314-1, 314-2, 314-3, 314-4 at a bottom surface of the interposer 310.

FIG. 3C depicts a transparent interposer 320 that includes a lens array portion 322 similar to the interposer 201 (i.e., with lenses 324-1, 324-2, 324-3, 324-4 at a top surface). The transparent interposer 320 also includes a stiffener 325 to provide structural support to the lens array portion 322. The stiffener 325 may be formed from materials such as glass, silicon, polymers, metals, plastics, and the like, and may be bonded to the lens array portion 322 by glass frit bonding, epoxy, solder bumping, etc. In some implementations, a cover 326 may be bonded to the stiffener 325 to protect the lenses 324. The cover 326 may be formed from transparent materials such as glass, plastic, etc. In the implementation depicted in FIG. 3C, the lenses 324 may be understood to be within a three-dimensionally stacked interposer 320. In some implementations, the stiffener 325 and cover 326 may be integrated and bonded to lens array portion 322 at the wafer scale. In other embodiments, the stiffener 325 may be molded onto the lens array portion 322 or the interposer 202.

Referring again to FIG. 2, in some implementations, the optoelectronic devices 210 may be light sources, such as top emitting VCSELs flip chip solder reflowed to the bottom surface 204 of the transparent interposer 202 (more particularly, to the RDL 206). By virtue of flip chip solder reflowing top emitting VCSEL optoelectronic devices 210 (also referred to as VCSELs 210) in this manner, the top emitting VCSELs 210 may emit light into the transparent interposer 202 in a direction extending from the bottom surface 204 to the top surface 203, or in other words, away from the substrate 220 and towards the WDM optical connector 260 when such connector is mated to the optical socket 240.

When the WDM optical connector 260 is mated to the optical socket 240 as shown, light emitted from each top emitting VCSEL 210 may be aimed via a respective lens 205 at a filter 262 of the WDM optical connector 260 having a wavelength characteristic associated with that top emitting VCSEL 210. For example, a first wavelength of light emitted by VCSEL 210-1 may be represented by a solid line passing through filter 262-1, a second wavelength of light may be represented by a short-dashed line passing through filter 262-2, a third wavelength of light may be represented by a long-dashed line passing through filter 262-3, and a fourth wavelength of light may be represented by a dot-dash line passing through filter 262-4. The WDM optical connector 260, and the filters 262 and the optical zig-zag cavity 264 in particular, then multiplex spatially separated light of different wavelengths from the VCSELs 210 into a single beam coupled into a waveguide 266, such as an optical fiber.

In the case where the optoelectronic devices 210 include light sources such as top emitting VCSELs, the plurality of lenses 205 may be collimating lenses to improve coupling of divergent light emitted from the light source optoelectronic devices 210 into the filters 262 and mode-matching it to the optical zig-zag cavity 264. As depicted in FIG. 2, the WDM optical connector 260 is at an angle relative to the beams of light emitted by the optoelectronic devices 210, to enable the light to zig-zag at least in part due to Snell's law. In some implementations, the optoelectronic devices 210 may be offset laterally in relation to a corresponding lenses 205, so as to induce an intentional deflection in the light paths as described above. The WDM optical connector 260 may be implemented with a different angle than depicted to enable the mode-matched optical zig-zag cavity 264 in accordance with such beam deflection, which may be useful for providing alternative packaging (e.g., different shapes or sizes) of the optical system 200.

The optical system 200 may also be used to demultiplex a WDM light signal received from the waveguide 266 via the optical zig-zag cavity 264 and filters 262, and separated wavelengths may be delivered from corresponding filters 262. In a demultiplexing case, the wavelength-specific arrows depicted in FIG. 2 should be understood to point in a reverse or opposite direction than shown, that is, in a direction from the waveguide 266 towards the optoelectronic devices 210. For demultiplexing, the optoelectronic devices 210 may include photodetectors to receive light delivered from the filters 262 of the WDM optical connector 260, such as surface illuminated photodetectors flip chip solder reflowed to the bottom surface 204 of the transparent interposer 202 (more particularly, to the RDL 206). The plurality of lenses 205 may be focusing lenses that collect light delivered from the filters 262 for coupling to the photodetector optoelectronic devices 210.

In some implementations, the optoelectronic devices 210 may include a combination or mixture of some flip chip solder reflowed light sources, such as top emitting VCSELs or light emitting diodes, and some flip chip solder reflowed photodetectors, such as surface illuminated p-i-n photodetectors or metal-semiconductor-metal photodetectors. The lenses 205 may include a collimating lens paired to each respective light source optoelectronic device 210 and a focusing lens paired to each respective photodetector optoelectronic device 210. In such implementations, a unitary optical engine and corresponding optical socket and mated WDM optical connector may provide two-way WDM light signals (i.e., send and receive).

Although four optoelectronic devices 210, corresponding lenses 205 and corresponding filters 262 are shown, it should be understood that the optical system 200 may be include more or fewer than four of such elements. Additionally, FIG. 2 depicts a cross-sectional side view, and it should be understood that additional elements may exist along a dimension extending into and/or out of the view depicted. For example, the optoelectronic device 530-1 may be a VCSEL bar or array that includes multiple individual VCSELs.

By virtue of flip chip solder reflowing optoelectronic devices to an interposer that is then flip chip solder reflowed to a substrate, low aspect ratio optoelectronic devices may be employed to reduce angular misalignment and improve optical coupling to a WDM optical connector. Additionally, thermal management may be simplified by providing access to the backside of the optoelectronic devices for heat extraction (e.g., via underfills).

Figure 4:
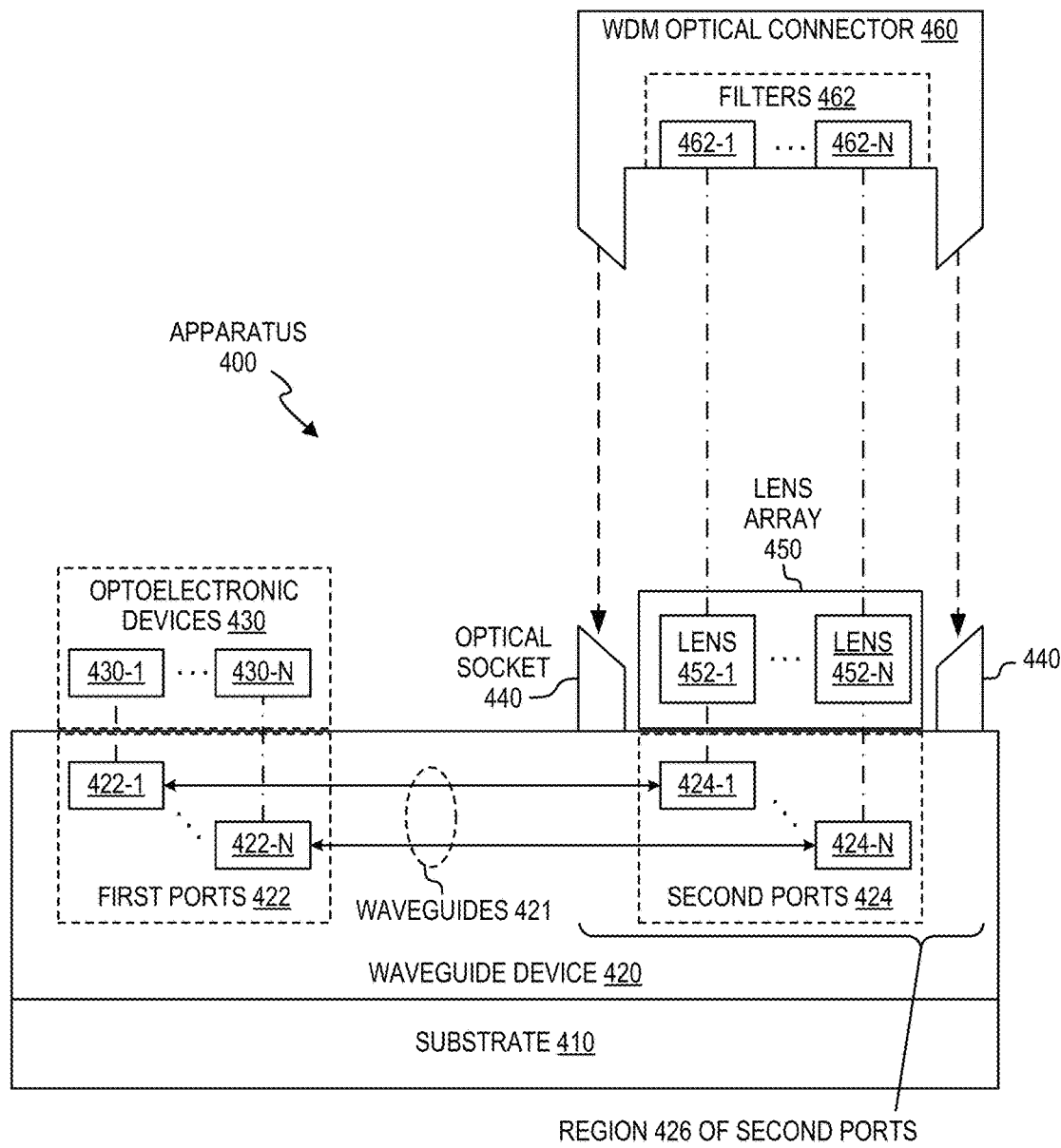
FIG. 4 depicts an example apparatus that includes optoelectronic devices mounted to a waveguide device and a lens array disposed on the waveguide device.

FIG. 4 depicts an example apparatus 400. The apparatus 400 includes a substrate 410 (such as a printed circuit board, flex circuit, glass interposer, silicon interposer, etc.), a waveguide device 420 (such as polymer waveguides, hollow metal waveguides, etc.), a plurality of optoelectronic devices 430-1 through 430-N, an optical socket 440, and a lens array 450. The apparatus 400 together with a WDM optical connector 460 may form an optical system.

The waveguide device 420 is disposed on the substrate 410. The waveguide device 410 has a plurality of waveguides 421 to direct light between respective first ports 422-1 through 422-N and second ports 424-1 through 424-N. The ports 422 and 424 may be composed of a coupling element such as a turning mirror, turning lens, grating coupler, etc.

The plurality of optoelectronic devices 430 is mounted to the waveguide device 420 in a region of the first ports 422 in particular. Each optoelectronic device 430 is paired to a corresponding port of the first ports 422, as depicted by dot-dash lines (e.g., optoelectronic device 430-1 is aligned to first port 422-1, etc.). In some implementations, the optoelectronic devices 430 are mounted to the substrate 410.

The optical socket 440 is disposed on the waveguide device 420 at a region 426 of the second ports 424. For example, the optical socket 440 may surround, partially surround, or be among the second ports 424. The optical socket 440 may receive a filter-based WDM optical connector 460 that has a plurality of filters 462-1 through 462-N and can multiplex and demultiplex light according to a manner described above.

The lens array 450 is disposed on the waveguide device 420 and within (e.g., surrounded by) the optical socket 440. The lens array 450 may be disposed on top of the second ports 424, and more particularly, each lens of a plurality of lenses 452-1 through 452-N of the lens array 450 may be coupled to a respective port of the second ports 424, as depicted by dot-dash lines (e.g., lens 452-1 is coupled to second port 452-1, etc.). Each lens 452 is paired to a respective filter 462 of the WDM optical connector 460 when the WDM optical connector 460 is mated to the optical socket 440, as depicted by dot-dash lines. The lens array 450 may resemble the lensed interposer mentioned in earlier sections. The lens array 450 may be flip chip solder reflowed or vision aligned to the waveguide device 420 or the substrate 410.

FIGS. 5A and 5B depict an example optical system 500 and will be discussed together. More particularly, FIG. 5A depicts a cross-sectional side view of the optical system 500, and FIG. 5B depicts a top view of the optical system 500 (with various components not shown, for clarity of illustration).

The optical system 500 may serve as an implementation of the optical system described above with respect to FIG. 4. The optical system includes a substrate 510 and a waveguide device 520 disposed on the substrate 510. The substrate 510 may be an organic substrate for flip chip assembly.

The waveguide device 520 may include a plurality of waveguides 521. In some implementations, the waveguides 521 may be step index polymer waveguides. The waveguides 521 may be fabricated by a microreplication method, a nanoimprint lithography method, a photolithography method, lamination, or the like. The waveguides 521 direct light between respective first ports 522 and second ports 524. The first ports 522 and the second ports 524 may couple light in to or out of the waveguide device 520, and in to or out of the waveguides 521 in particular. In some implementations, the plurality of waveguides 521 may direct light in a plane substantially parallel to the substrate 510. The waveguide device 520 may include angled mirrors or grating couplers 526 to direct light between the plurality of waveguides 521 and respective first ports 522. The waveguide device 520 may also include angled mirrors or grating couplers 528 to direct light between the plurality of waveguides 521 and respective second ports 524. In some implementations, the waveguides 521 between the respective first ports 522 and second ports 524 may be curved, as depicted in FIG. 5B. In other implementations, the waveguides 521 may be straight or may include bends (e.g., 90° angles or other angles).

The waveguide device 520 may include pads and solder bumps for mounting by flip chip solder reflow of optoelectronic devices 530 and/or a lens array 550. The waveguide device 520 also may include redistribution layers (similar to RDLs described above).

An optical socket 540 may be disposed on the waveguide device 520 in a region of the second ports 524. For example, the optical socket 540 may be similar in many respects to the optical socket 240, and may frame or surround the ports 524. The optical socket 540 may receive a filter-based WDM optical connector 560, which has a plurality of filters 562-1, 562-2, 562-3, 562-4 (collectively filters 562 or individually and generally a filter 562) and an optical zig-zag cavity 564. The WDM optical connector 560 may be similar in many respects to the WDM optical connector 260 described above, and may multiplex or demultiplex light of different wavelengths (e.g., depicted in solid line, short-dashed line, long-dashed line, and dot-dash line).

A lens array 550 may be disposed on the waveguide device 520 and within the optical socket 540. Each lens of a plurality of lenses of the lens array 550 may be coupled to or paired with a respective port of the second ports 524, and each lens may be paired to a respective filter 562 of the WDM optical connector 560 when the WDM optical connector 560 is mated to the optical socket 540. The lens array 550 may be flip chip solder reflowed to the waveguide device 520 to self-align the lens array 550 to the second optical ports 524, and underfilled with a transparent optical underfill index matched to the waveguide device 520 and/or the lens array 550. In some implementations. the lens array 550 may be a separate element from the optical socket 540. In other implementations, the lens array 550 may be integrated with the optical socket, and the integrated device may be solder reflowable (e.g., to the waveguide device 520).

A plurality of optoelectronic devices 530-1, 530-2, 530-3, 530-4 may be flip chip solder reflowed to the waveguide device 520 or the substrate 510, and each optoelectronic device 530 may be paired to a corresponding port of the first ports 522. The optoelectronic devices may be underfilled with a transparent optical underfill. In some implementations, a heat sink 570 may be coupled to the optoelectronic devices 530. An integrated circuit 580 may be mounted (by flip chip solder reflowing) to the substrate 510 adjacent to the optoelectronic devices 530 and may be electrically coupled to the optoelectronic devices 530. The integrated circuit 580 may include electronics for controlling the optoelectronic devices 530. A separate heat sink may be coupled to the integrated circuit 580.

In some implementations, the optoelectronic devices 530 are top emitting VCSELs flip chip solder reflowed to the waveguide device 520, each of the top emitting VCSEL optoelectronic devices 530 (also referred to as VCSELs 530) are positioned to emit light into the corresponding port of the first ports 522. Other types of light sources may be implemented in other examples. In some implementations, as depicted in FIG. 5B, the optoelectronic devices 530 (and VCSELs in particular) may be bar-shaped, each bar having multiple independent optoelectronic devices fabricated together. Different bars may emit different wavelengths of light. Other types and form factors of devices may be implemented. Employing VCSELs controlled by the integrated circuit 580 may be useful for converting electronic signals to multiplexed light signals for transmission at the WDM optical connector 560.

Light from a particular top emitting VCSEL 530 is emitted into a corresponding port of the first ports 522, is directed by a corresponding waveguide of the plurality of waveguides 521, is emitted from a corresponding port of the second ports 524, and is aimed through a lens of the lens array 550 (e.g., a collimating lens) toward a filter 562 of the WDM optical connector 560 having a wavelength characteristic associated with that particular VCSEL 530 so as to allow transmission of the light into the optical zig-zag cavity 564. The foregoing may be applied to each of the top emitting VCSELs 530. For example, light of a first wavelength (solid line) emitted by a VCSEL 530-1 is directed via the waveguide device 520 through the lens array 550 to the filter 562-1 and the optical zig-zag cavity 564. Similarly, the waveguide device 520 carries light of a second wavelength (short-dashed line) emitted by a VCSEL 530-2, light of a third wavelength (long-dashed line) emitted by a VCSEL 530-3, and light of a fourth wavelength (dot-dash line) emitted by a VCSEL 530-4, to the lenses of the filter array 550, and to the filters 562-2, 562-3, and 562-4 respectively.

In some implementations, the optoelectronic devices 530 are surface illuminated photodetectors. Each of the photodetector optoelectronic devices 530 (which may be referred to as photodetectors 530) may receive light from a corresponding port of the first ports 522. The optoelectronic devices 530 may be multiple photodetector chips or a single large chip with an array of photodetectors. Employing photodetectors 530 coupled to integrated circuitry 580 may be useful for converting multiplexed light signals received at the WDM optical connector 560 to electronic signals.

In an example employing photodetectors, the wavelength-specific arrows depicted in FIG. 5A should be understood to point in a reverse or opposite direction than shown. For example, the fourth wavelength represented by a dot-dash line enters the WDM optical connector 560, is demultiplexed by the optical zig-zag cavity 564 and the filter 562-4, passes through the lens array 550 (e.g., comprising focusing lenses), is directed by the waveguide device 520 (i.e., a port of the second ports 524, a waveguide 521, and a port of the first ports 522), and impinges on a photodetector 530-4.

As with the optical system 200, the optoelectronic devices 530 may be a combination or mixture of some light sources, such as VCSELs or light emitting diodes, and photodetectors, such as surface illuminated p-i-n photodetectors or metal-semiconductor-metal photodetectors. For example, a portion of the first ports 522 and a corresponding portion of the second ports 524 are associated with light source optoelectronic devices 530 while a different portion of the first ports 522 and corresponding portion of the second ports 524 are associated with photodetector optoelectronic devices 530. In such cases, the lens array 550 may include a collimating lens coupled to or paired with each first port associated with a light source optoelectronic device 530 and a focusing lens coupled to or paired with each first port associated with a photodetector optoelectronic device 530. Accordingly, a unitary optical engine and corresponding optical socket and mated WDM optical connector may provide two-way WDM light signals (i.e., send and receive).

By virtue of the foregoing, an optical engine comprising the optoelectronic devices 530 may be positioned outside the optical socket 540. Owing to such positioning, the spacing between the lenses of the lens array 550, as well as the spacing between the filters 562, may be designed independently of the geometry (e.g., size, spacing, etc.) of the optoelectronic devices 530. Said another way, a spatial density of the plurality of lenses of the lens array 550 may be different from (e.g., greater than or less than) a spatial density of the optoelectronic devices 530, where spatial density may be understood as a number of elements in a square area or a similar measure. Thus, a size or spacing of the optoelectronic devices 530 or the optical socket 540 and the WDM optical connector 560 may be reduced. Additionally, thermal management and electrical signal management of the optical engine may be handled independent of size requirements associated with the optical socket 540 or WDM optical connector 560. For example, a heat sink 570 can be directly and simply attached to the optoelectronic devices 530. Additionally, the integrated circuit 580 may be located close to the optoelectronic devices 530 to reduce the length of circuit traces. At least some of the foregoing aspects may also be applicable to the apparatus 400.

Figure 6:
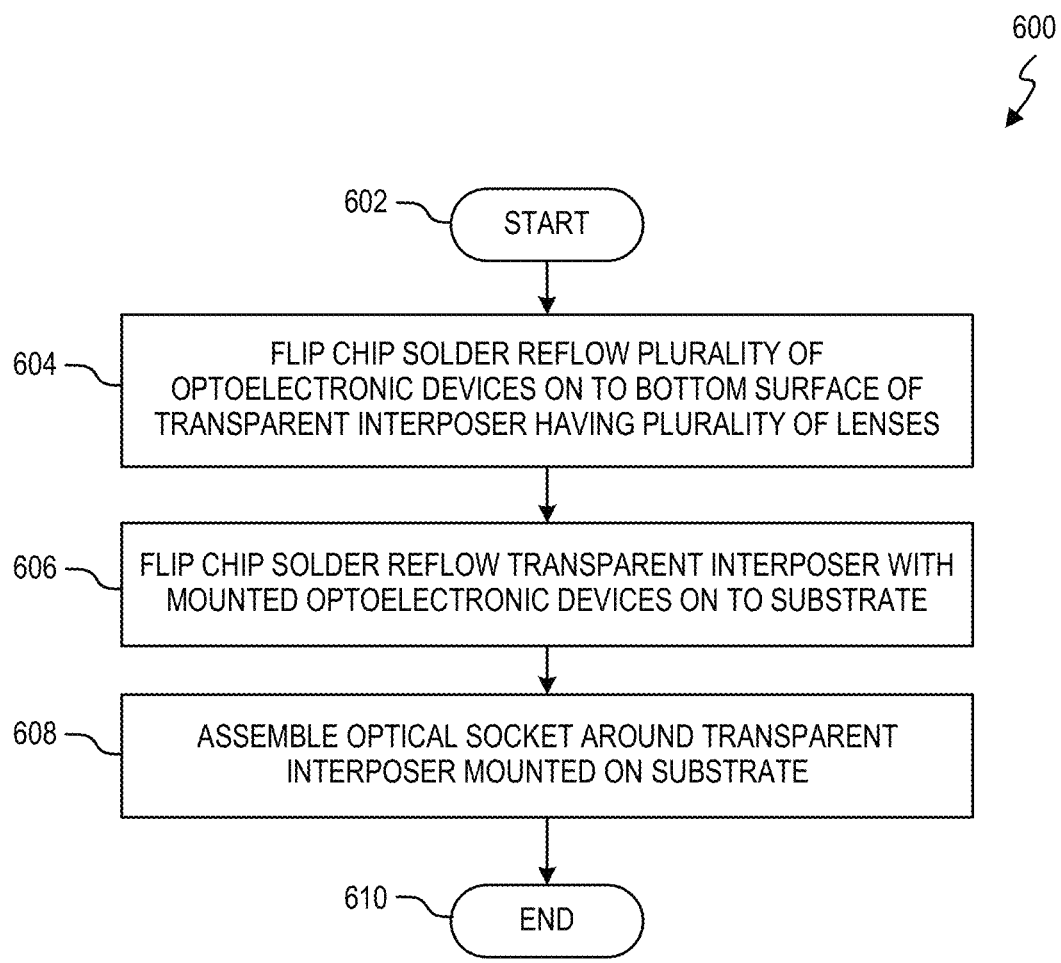
FIG. 6 is a flow diagram of an example method for mounting a plurality of optoelectronic devices to an interposer and mounting the interposer to a substrate.

FIG. 6 is a flow diagram of an example method 600 for mounting a plurality of optoelectronic devices (e.g., 130 or 210) to an interposer (e.g., 110 or 202) and mounting the interposer to a substrate (e.g., 140 or 220). At least some of method 600 may be performed by wafer-scale fabrication and assembly processes. The method 600 may be useful for making the apparatus 100 or 201.

The method 600 may begin at block 602, and continue to block 604, which includes flip chip solder reflowing a plurality of optoelectronic devices (e.g., 130 or 210) on to a bottom surface (e.g., 114 or 204) of a transparent interposer (e.g., 110 or 202). The transparent interposer includes a plurality of lenses (e.g., 120 or 205) and the flip chip solder reflowing at block 604 positions (i.e., self-aligns) each of the optoelectronic devices at a respective lens of the plurality of lenses. Flip chip solder reflowing at block 604 may utilize solder bumps (e.g., 212).

Block 606 includes flip chip solder reflowing the transparent interposer with optoelectronic devices mounted thereon on to a substrate (e.g., 140 or 220), resulting in the optoelectronic devices being located between the transparent interposer and the substrate and indirectly aligned to the substrate via the interposer. Flip chip solder reflowing at block 606 may utilize solder bumps (e.g., 224).

Block 608 includes assembling an optical socket (e.g. 150 or 240) to a position on the substrate around the transparent interposer that was mounted on the substrate at block 606. The assembly position is such that the optical socket, when it receives a filter-based WDM optical connector (e.g., 160 or 260), holds or constrains the WDM optical connector in an orientation that pairs each filter (e.g., 162 or 262) of the mated WDM optical connector to a respective lens of the plurality of lenses (e.g., 120 or 205) of the transparent interposer. In other words, each lens of the plurality of lenses is paired to a respective filter of the WDM optical connector when the WDM optical connector is received by the optical socket. At block 610, the method 600 ends.

Figure 7:
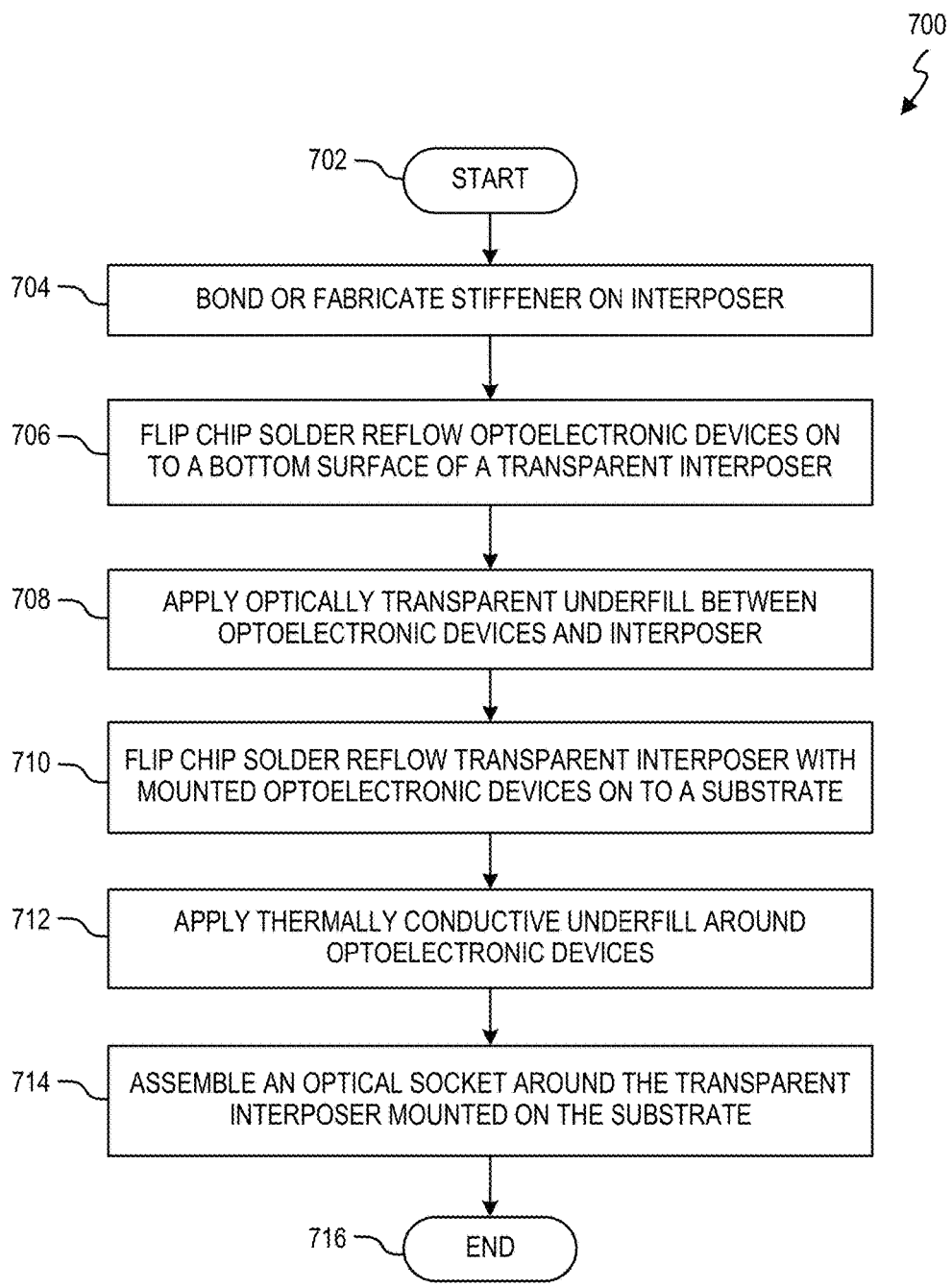
FIG. 7 is a flow diagram of another example method for mounting a plurality of optoelectronic devices to an interposer and mounting the interposer to a substrate.

FIG. 7 is a flow diagram of another example method 600 for mounting a plurality of optoelectronic devices (e.g., 130 or 210) to an interposer (e.g., 110 or 202) and mounting the interposer to a substrate (e.g., 140 or 220). At least some of method 700 may be performed by wafer-scale fabrication processes. The method 700 may be useful for making the apparatus 100 or 201.

The method 700 may begin at block 702 and continue to block 704, where a stiffener (e.g., 324) is bonded to a transparent interposer (e.g., 322). In some implementations, a transparent cover may also be bonded (e.g., 326) to the stiffener. Various bonding processes may be employed, such as glass frit bonding, epoxying, solder bumping, etc., depending on the materials of the interposer, stiffener, and/or cover. In some implementations, RDLs (e.g., 206) also are fabricated on the interposer.

At block 706, optoelectronic devices (e.g., 130 or 210) are flip chip solder reflowed to the bottom surface (e.g., 204) of the transparent interposer. Block 706 may be analogous in many respects to block 604.

At block 708, after flip chip solder reflowing the plurality of optoelectronic devices on to the bottom surface of the transparent interposer at block 706, an optically transparent underfill (e.g., 226) is applied between the optoelectronic devices and the bottom surface of the transparent interposer.

Block 710 may be analogous to block 606 described above. For example, the transparent interposer with optoelectronic devices mounted thereon may be flip chip solder reflowed on to a substrate (e.g., 140 or 220).

At block 712, after flip chip solder reflowing the transparent interposer on to the substrate at block 708, a thermally conductive underfill (e.g., 228) is applied between the optoelectronic devices and the substrate (e.g., gap 230) and around the optoelectronic devices. In some implementations, the interposer may have been flip chip mounted closely to the substrate at block 710 such that the optoelectronic devices are in contact with the substrate, in which case the thermally conductive underfill may be applied at block 712 solely around the optoelectronic devices.

At block 714, an optical socket is assembled around the interposer, in a manner analogous to block 608 described above. At block 716, the method 700 ends.

In the foregoing description, numerous details are set forth to provide an understanding of the subject matter disclosed herein. However, implementation may be practiced without some or all of these details. Other implementations may include modifications and variations from the details discussed above. It is intended that the following claims cover such modifications and variations.

What is claimed:

1. An apparatus comprising:
a transparent interposer having a top surface, a bottom surface opposite the top surface, and an integrated plurality of lenses; and
a plurality of optoelectronic devices mounted to the bottom surface of the transparent interposer, each of the optoelectronic devices being paired to a respective lens of the plurality of lenses; wherein
the bottom surface of the transparent interposer mounted to a substrate within a region of an optical socket mounted to the substrate, the optical socket to receive a filter-based wavelength-division multiplexing (WDM) optical connector, and
each lens of the plurality of lenses being paired with a respective filter of the WDM optical connector when the WDM optical connector is mated to the optical socket.

2. The apparatus of claim 1, wherein the optoelectronic devices include top-emitting vertical-cavity surface-emitting lasers (VCSELs) flip chip mounted to the bottom surface of the transparent interposer to emit light into the transparent interposer in a direction extending from the bottom surface to the top surface, each VCSEL being aimed at a filter of the WDM optical connector having a wavelength characteristic associated with the each VCSEL, and
the plurality of lenses including collimating lenses.

3. The apparatus of claim 1, wherein the optoelectronic devices include surface-illuminated photodetectors to receive light delivered by the WDM optical connector, and
the plurality of lenses including focusing lenses.

4. The apparatus of claim 1, wherein
the transparent interposer is glass,
the transparent interposer includes a redistribution layer on the bottom surface,
the optoelectronic devices are flip chip mounted to the redistribution layer on the bottom surface by a first set of solder bumps, and
the bottom surface of the transparent interposer is flip chip mounted to the substrate by a second set of solder bumps that are at least as tall as the optoelectronic devices mounted to the bottom surface.

5. The apparatus of claim 1, further comprising an optically transparent underfill between the bottom surface of the transparent interposer and the plurality of optoelectronic devices mounted to the bottom surface of the transparent interposer.

6. The apparatus of claim 1, further comprising a thermally conductive underfill between the optoelectronic devices and the substrate and between the bottom surface of the transparent interposer and the substrate.

7. The apparatus of claim 1, wherein the plurality of lenses are at the top surface of the transparent interposer.

8. The apparatus of claim 1, wherein the transparent interposer includes a stiffener.

9. A method comprising:
flip chip solder reflowing a plurality of optoelectronic devices on to a bottom surface of a transparent interposer, wherein the transparent interposer includes a plurality of lenses and the flip chip solder reflowing positions each of the optoelectronic devices in a pairing with a respective lens of the plurality of lenses; and
flip chip solder reflowing the transparent interposer with mounted optoelectronic devices on to a substrate, resulting in the optoelectronic devices being located between the transparent interposer and the substrate,
assembling an optical socket to a position on the substrate around the transparent interposer mounted on the substrate, the optical socket at the position being to receive a filter-based wavelength-division multiplexing (WDM) optical connector in an orientation that pairs filters of the received WDM optical connector with respective lenses of the plurality of lenses of the transparent interposer.

10. The method of claim 9, further comprising, after flip chip mounting the plurality of optoelectronic devices on to the bottom surface of the transparent interposer, applying an optically transparent underfill between the optoelectronic devices and the bottom surface of the transparent interposer.

11. The method of claim 10, further comprising, after flip chip mounting the transparent interposer on to the substrate, applying a thermally conductive underfill between the optoelectronic devices and the substrate and around the optoelectronic devices.

12. The method of claim 9, further comprising bonding a stiffener to the transparent interposer.

13. The method of claim 10, wherein the optoelectronic devices include:
top-emitting vertical-cavity surface-emitting lasers to emit light into the transparent interposer, or
surface-illuminated photodetectors to receive light delivered by the WDM optical connector.

14. An apparatus comprising:
a substrate;
a waveguide device disposed on the substrate, the waveguide device having a plurality of waveguides to direct light between respective first ports and second ports;
a plurality of optoelectronic devices mounted to the waveguide device, each optoelectronic device of the optoelectronic devices paired to a corresponding port of the first ports;
an optical socket disposed on the waveguide device in a region of the second ports, the optical socket to receive a filter-based wavelength-division multiplexing (WDM) optical connector; and
a lens array disposed on the waveguide device and within the optical socket, each lens of a plurality of lenses of the lens array coupled to a respective port of the second ports, and each lens being paired to a respective filter of the WDM optical connector when the WDM optical connector is mated to the optical socket, wherein the optoelectronic devices are positioned outside the optical socket.

15. The apparatus of claim 14, wherein
the plurality of waveguides direct light in a plane parallel to the substrate, and
the waveguide device includes angled mirrors, turning lenses, or grating couplers to direct light between the plurality of waveguides and respective first ports and between the plurality of waveguides and respective second ports.

16. The apparatus of claim 15, wherein
the optoelectronic devices are top-emitting vertical-cavity surface-emitting lasers (VCSELs) flip chip mounted to the waveguide device, each of the VCSELs to emit light into the corresponding port of the first ports, and light from each VCSEL being emitted into a corresponding port of the first ports, being directed by a corresponding waveguide of the plurality of waveguides, being emitted from a corresponding port of the second ports, and being aimed through a lens of the lens array at a filter of the WDM optical connector having a wavelength characteristic associated with the each VCSEL.

17. The apparatus of claim 15, wherein the optoelectronic devices are surface-illuminated photodetectors, each of the photodetectors to receive light from the corresponding port of the first ports, and light received by the photodetectors from the first ports being delivered by the WDM optical connector through the second ports and the waveguide device to the first ports.

18. The apparatus of claim 14, further comprising a heat sink coupled to the optoelectronic devices.

19. The apparatus of claim 14, further comprising integrated circuit mounted to the substrate adjacent to the optoelectronic devices, the control circuitry being coupled to the optoelectronic devices.

20. The apparatus of claim 14, wherein a spatial density of the plurality of lenses is different from a spatial density of the optoelectronic devices.

* * * * *